United States Patent [19]
Chang

[11] Patent Number: 5,930,628
[45] Date of Patent: Jul. 27, 1999

[54] METHOD FOR FABRICATING ONE TIME PROGRAMMABLE READ ONLY MEMORY

[75] Inventor: Kuang-Yeh Chang, Taipei, Taiwan

[73] Assignee: United Microelectronics Corp.

[21] Appl. No.: 09/093,691

[22] Filed: Jun. 9, 1998

[30] Foreign Application Priority Data

Apr. 14, 1998 [TW] Taiwan ................................. 87105614

[51] Int. Cl.⁶ .................................................. H01L 21/336
[52] U.S. Cl. ........................................... 438/258; 438/257
[58] Field of Search ..................................... 438/258, 257

[56] References Cited

U.S. PATENT DOCUMENTS

| | | | |
|---|---|---|---|
| 5,723,375 | 3/1998 | Ma et al. ................................... | 438/258 |
| 5,789,294 | 8/1998 | Choi ......................................... | 438/258 |
| 5,811,852 | 9/1998 | Ling ......................................... | 257/315 |

OTHER PUBLICATIONS

Wolf, S.; Silicon Processing for the VLSI Era, vol. 3; Lattice Press, Sunset Beach, Ca.; pp. 586–587, 608–609, 1995.

*Primary Examiner*—John F. Niebling
*Assistant Examiner*—Neal Berezny
*Attorney, Agent, or Firm*—Thomas, Kayden, Horstemeyer & Risley

[57] ABSTRACT

A method for fabricating a one-time programmable read only memory includes forming a spacer to cover the sides of the periphery transistor gate before patterning the control gate, then patterning the polysilicon layer to form a floating gate, and then forming a heavily concentrated ion implantation area in the substrate beneath the sides of the floating gate. Since the spacer is deposited on the sidewalls of the polysilicon layer within the peripheral area, but not the memory cell area, the efficiency of programming is improved. In addition, there is no need for extra ion implantation processes for make up for the lower programming efficiency caused by the spacers. Furthermore, the leakage current that is caused by the damage to the field oxide generated during the etching back process for forming the spacer is eliminated.

12 Claims, 2 Drawing Sheets

METHOD FOR FABRICATING ONE TIME PROGRAMMABLE READ ONLY MEMORY

CROSS-REFERENCE TO RELATED APPLICATION

This application claims the priority benefit of Taiwan application serial no. 87105614, filed Apr. 14, 1998, the full disclosure of which is incorporated herein by reference.

BACKGROUND OF THE INVENTION

1. Field of the Invention

This invention relates to a method for fabricating a memory, and more particularly, to a method for fabricating a one time programmable read only memory (OTP-ROM).

2. Description of Related Art

The requirement for a memory is rising from day to day because microprocessors are becoming more powerful and software programs and computations are getting larger. Thus, it is a major task for the manufacturers of semiconductor devices to develop and fabricate high-capacity and economical memories to fulfill the market requirement. According to the basic read/write functions, memories are simply classified into two categories: read only memory (ROM) and random access memory (RAM). A ROM can only perform the reading task, but a RAM can perform both the reading and writing tasks. ROMs can be classified according to their method of data storing: mask ROM, programmable ROM (PROM), erasable programmable ROM (EPROM), and electrically erasable programmable ROM (EEPROM). On the other hand, RAMs can also be classified into the categories of static RAM (SRAM) and dynamic RAM (DRAM).

ROMs are widely used in mini-computers, microprocessor systems, and other digital devices for storing system information and the terminate and stay resident (TSR) programs such as BIOS. Since the fabrication of a ROM is very complicated, and includes numerous time-consuming processes and preparations for materials, the manufacturers normally code the needed programs and information from customers into memories within the fabrication process.

Since the rest of the structures, with the exception of the information stored during the programming process, are the same for most ROMs, ROMs are normally stocked semi-manufactured, at the stage before the programming process. After a specific program or information is given, the whole fabrication process of a ROM is quickly finished by patterning a mask and performing only the programming process. The foregoing method, which is a so-called post-programming mask-type ROM, is commonly used in industry.

A channel transistor is normally used as a memory cell in a ROM. Within the programming process, desired channel areas of a channel transistor are selectively implanted with dopants, such as boron, to change the threshold voltage to control the on/off of a memory cell. A ROM structure includes a polysilicon word line WL crossing a bit line BL, and the channels of the memory cells located at the regions between bit lines BL and beneath the word line WL. In a ROM, the stored binary data, 0 or 1, is dependent on whether or not the channel has ions implanted.

FIGS. 1A, 1B, and 1C are sectional diagrams showing a conventional fabrication process for a PROM, wherein FIGS. 1B and 1C have the same sectional direction, which is perpendicular to the sectional direction of FIG. 1A.

As shown in FIG. 1A, a substrate 10 is provided. The substrate 10 has a patterned memory cell area 9 and peripheral area. The peripheral area includes an NMOS active area 7 and a PMOS active area 8, and the PMOS active area 8 has an N well 11 formed on the substrate 10. A pad oxide layer (not shown) is then formed on the substrate 10 by a thermal oxidation process. A field oxide 14 is next formed on the substrate 10 by a local oxidation process to pattern an active area, and then the pad oxide layer is removed by a method such as a wet etching process. After that, an oxide layer 12 is formed on the surface of the active area by a thermal oxidation process. Then a polysilicon layer 16 is formed on the top of the oxide by a deposition process, such as a low-pressure chemical vapor deposition (LPCVD), wherein the polysilicon layer is then patterned by employing a photolithography and an etching processes.

A layer of inter-polysilicon dielectric material is formed on the top of the polysilicon layer 16 by a process such as a LPCVD process, and another layer of polysilicon is then formed on the top of the inter-polysilicon dielectric layer by a process such as a LPCVD process. A photolithography process and an etching process are performed to pattern and etch downward the layers of polysilicon and inter-polysilicon dielectric materials to form a polysilicon layer 20 and an inter-polysilicon dielectric layer 18. At the same time, a plurality of polysilicon layers 20 is formed on the peripheral area.

Referring to FIG. 1B, an etching process is performed to pattern the polysilicon layer 16 by using the polysilicon layer 20 as a mask. An n-type ion implantation process with a heavy concentration of ions is performed to form an ion implantation region 22 on the substrate 10 by using the polysilicon layer 20 as a mask in the memory cell, excluding the periphery area 7 and 8 that are covered by a mask. Another mask is used to cover the memory cell area 9 and the active area of the PMOS 8 for processing a conventional n-type ion implantation process to form an n-type ion implantation region of a light concentration 24 on the substrate of the active area of the NMOS 7. After removing the mask and using another mask to cover the memory cell area 9 and the active area of the NMOS 7, a conventional p-type ion implantation process is performed to form a p-type ion implantation region of a light concentration 26 on the substrate of the active area of the PMOS 8, and then the mask is removed.

Referring to FIG. 1C, an oxide layer is deposited to cover the semiconductor substrate and the structures thereon by using a method such as a LPCVD, and then an etching back process is performed to form spacers 28 of oxide on the sidewalls of the polysilicon layer 20 on the active areas of the NMOS 7 and the PMOS 8. This etching back process forms a spacer on the sidewalls of the polysilicon layer 20, dielectric layer 18, and polysilicon layer 16 as well.

Then, a conventional ion implantation process is performed to form a p-type ion implantation region of a heavy concentration 30 on the substrate of the active area of the PMOS 8 by using a mask covering the active area of the NMOS 7 and the memory cell 9, after which the mask is removed. Again, a conventional ion implantation process is performed to form an n-type ion implantation region of a heavy concentration 32 on the substrate of the active area of the NMOS 7 by using a mask covering the active area of the PMOS 8, and an n-type ion implantation region of a heavy concentration 34 on the substrate of the active area of the memory cell area.

The rest of the fabrication process for accomplishing an OTP-ROM that can be easily done by persons skilled in the art and is not described here.

The spacer structure 28 in a conventional PROM decreases the efficiency of programming. Even though the presence of the n-type ion implantation of a heavy concentration 22 can improve the efficiency of programming, the fabrication process becomes more complicated. Furthermore, the process of forming spacers in the memory cell area has to include etching back, which damages the field oxide and the polysilicon surface in the memory cell area, and further causes leakage current.

SUMMARY OF THE INVENTION

It is therefore an objective of the present invention to provide a method for fabricating an OTP-ROM to overcome the drawbacks of a conventional PROM.

In accordance with the foregoing and other objectives of the present invention, the invention provides a method for fabricating an OTP-ROM including forming a spacer to cover the sides of the control gate before patterning the polysilicon layer for forming the floating gate, patterning the floating gate, and forming the ion implantation area in the substrate beneath the sides of the floating gate.

Spacers within the structure of the OTP-ROM of the invention are located on the sidewalls of the polysilicon layers in the peripheral areas but not the memory cell area, so that the efficiency of programming can be improved.

The OTP-ROM of the invention simplifies the fabrication process and improves the efficiency of programming because there are no spacers in the memory cell area, and there is no need for an extra ion implantation process of a heavy concentration.

Furthermore, spacers are formed before the control gates are formed, so the damages to the field oxide caused by the etching back process needed for forming spacers can be eliminated. The leakage current is eliminated as well.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
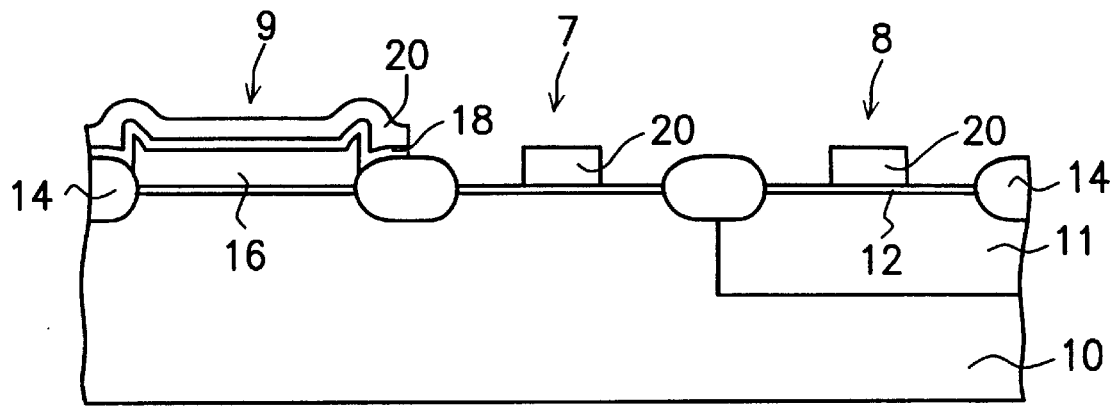
FIGS. 1A to 1C are sectional diagrams showing a fabrication process of a conventional programmable read only memory.
Figure 1B:
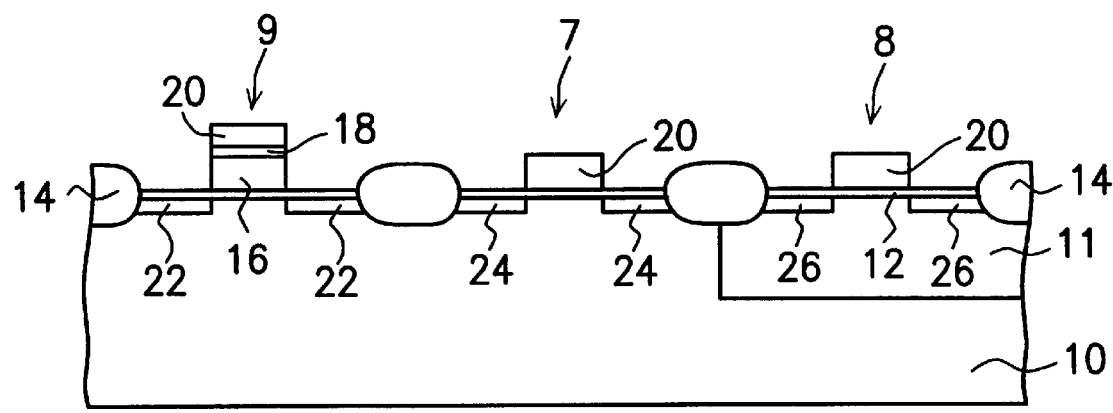
Figure 1C:
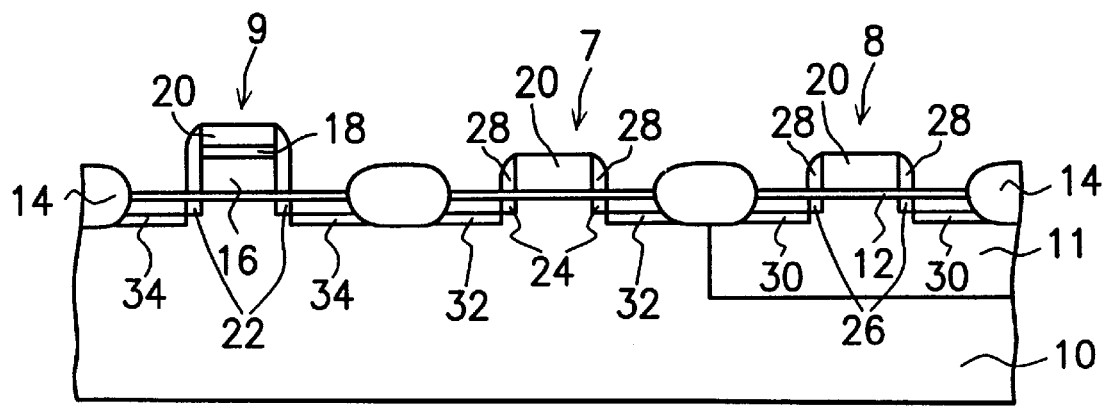
Figure 2A:
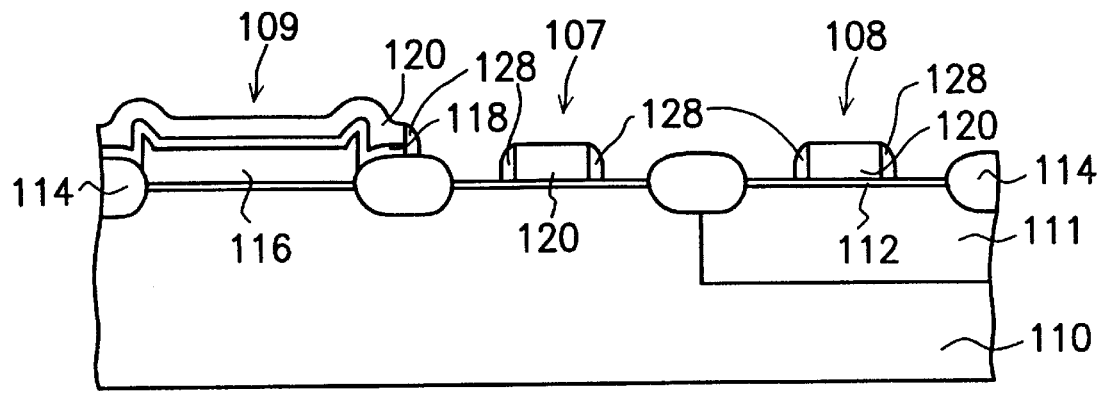
FIGS. 2A to 2C are sectional diagrams showing the fabrication process of a one time programmable read only memory in a preferred embodiment according to the invention.
Figure 2B:
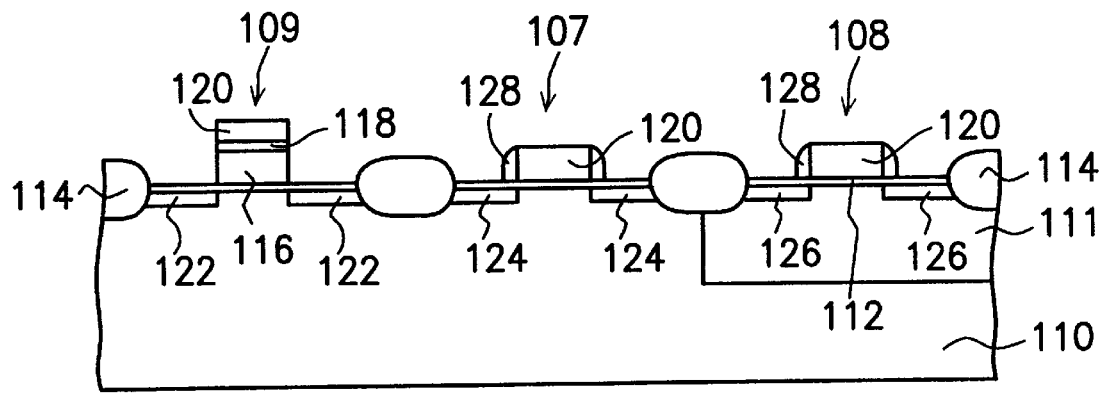
Figure 2C:
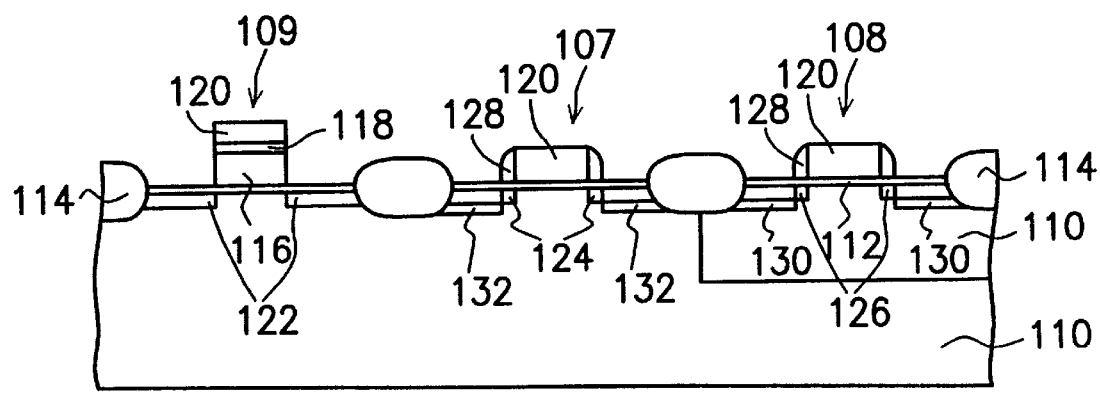

FIGS. 2A, 2B, and 2C are sectional diagrams showing the fabrication process for an OTP-ROM in an embodiment according to the invention, wherein FIGS. 2B and 2C have the same sectional direction, which is perpendicular to the sectional direction of FIG. 2A.

Referring to FIG. 2A, a substrate 110 including predefined memory cell area 109 and peripheral area is provided, wherein the peripheral area includes an active area of an NMOS 107 and an active area of a PMOS 108, and wherein the active area of the PMOS 108 includes an n-well 111 formed on the substrate 110. A pad oxide layer (not shown) is then formed on the substrate 110 by a thermal oxidation process. Then, a field oxide layer 114 is formed on the substrate 110 to pattern the active area by a process such as a local oxidation followed by removing the pad oxide layer by a process such as a wet etching process. An oxide layer 112 is formed on the active area by a thermal oxidation process. Then, a LPCVD process is used to form a polysilicon layer on the oxide layer 112, wherein the polysilicon layer is later on patterned as polysilicon layer 116 by photolithography and etching processes.

An inter-polysilicon dielectric layer is formed to cover the polysilicon layer 116 by a process, such as a LPCVD process. Then, another polysilicon layer is formed on the top of the inter-polysilicon dielectric layer by a LPCVD process. Photolithography and etching processes are then used to pattern the polysilicon layer 120 and inter-polysilicon layer 118. At the same time, a polysilicon layer 120 is also formed on the active area of the peripheral area.

A conventional n-type ion implantation process is performed to form an n-type ion implantation area of a light concentration 124 in the substrate of the active area of the NMOS 107. This is done with a mask to cover the memory cell area 109 and the active area of the PMOS 108. The mask is then removed. Then, a conventional p-type ion implantation process of is performed to form a p-type ion implantation area of a light concentration 126 in the substrate of the active area of the PMOS 108. This is done with a mask is then formed to cover the memory cell area 109 and the active area of the NMOS 107. The mask is also removed after the above process is finished.

Then, a layer of oxide is deposited by a process, such as a LPCVD process, to cover the semiconductor substrate 110 and devices thereon. The oxide is then turned into spacers 128 on the sidewalls of the polysilicon layer 120 within the active area of the NMOS 107 and the active area of the PMOS 108 by an etching back process. In the mean time, spacers 128 are also formed on the sidewalls of the polysilicon layer 120, dielectric layer 118 and the polysilicon layer 116 within the memory cell area 109.

Referring to FIG. 2B, the polysilicon layer 116 is further patterned by another photo mask, and the dielectric layer 118 and the polysilicon layer 116 are subsequently etched, wherein the polysilicon layer 116 is a floating gate and the polysilicon layer 120 is a control gate, i.e. a word line. Referring to FIG. 2C, a conventional ion implantation process is performed to form a p-type ion implantation area of a heavy concentration 130 in the substrate of the active area of the PMOS 108. this is done with a mask to cover the active area of the NMOS 107 and the memory cell area 109, and the mask is then removed. A conventional ion implantation process of n-type is performed to form an n-type ion implantation area of a heavy concentration 132 and 122 in the substrate of the active area of the NMOS 107 and the memory cell area 109. This is done with a mask to cover the active area of the PMOS 108.

The rest of the fabrication process of an OTP-ROM is performed. These processes can be easily done by persons skilled in the art and are not described here.

Spacers within the structure of OTP-ROM of the invention are located on the sidewalls of the polysilicon layer 120 in the peripheral areas but not the memory cell area, improving efficiency of programming.

The OTP-ROM of the invention simplifies the fabrication process and improves the efficiency of programming because there are no spacers in the memory cell area, and no need for an extra n-type ion implantation process of a heavy concentration.

Furthermore, spacers 128 are formed before the floating gates are formed, so the damages on field oxide 114 caused by the etching back process needed for forming spacers 128 can be eliminated. The leakage current is eliminated as well.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A method for fabricating a one time programmable read only memory comprising:

provinding a substrate having a peripheral area and a memory cell area;

forming a first polysilicon layer on the memory cell area of the substrate;

performing a patterning process on the first polysilicon layer for exposing the memory cell area of the substrate;

forming a dielectric layer over the first polysilicon layer and the substrate;

forming a second polysilicon layer over the dielectric layer;

forming a control gate by performing a patterning process on the second polysilicon layer;

performing a first ion implantation process for forming a first ion implantation area in the memory cell area of the substrate;

performing a second ion implantation process for forming a second ion implantation area in the peripheral area of the substrate;

forming a spacer on sidewalks of the patterned second polysilicon layer and the dielectric layer;

further performing a patterning process on the first polysilicon layer, after forming the spacer on the sidewalls of the control gate, to form a floating gate by using the second polysilicon layer as a mask; and performing a third ion implantation process for forming a third ion implantation area in the peripheral area of the substrate.

2. The method of claim 1, wherein the first ion implantation area is an ion implantation area of a heavy concentration.

3. The method of claim 1, wherein the second ion implantation area is an ion implantation area of a light concentration.

4. The method of claim 1, wherein the third ion implantation area is an ion implantation area of a heavy concentration.

5. The method of claim 1, wherein the step of forming the spacer is before the step of forming the floating gate.

6. The method of claim 1, wherein the step of forming the first polysilicon layer includes a low-pressure chemical vapor deposition process.

7. The method of claim 1, wherein the step of patterning the first polysilicon layer includes a photolithography and an etching processes.

8. The method of claim 1, wherein the step of forming the dielectric layer includes a low-pressure chemical vapor deposition process.

9. The method of claim 1, wherein the step of forming the second polysilicon layer includes a low-pressure chemical vapor deposition process.

10. The method of claim 1, wherein the step of patterning the second polysilicon layer includes a photolithography and an etching process.

11. The method of claim 1, wherein the step of patterning the second polysilicon layer further includes patterning the dielectric layer.

12. The method of claim 1, wherein the further patterning the first polysilicon layer includes a photolithography and an etching process.

* * * * *